US006829755B2

United States Patent
Gutwin et al.

(10) Patent No.: US 6,829,755 B2
(45) Date of Patent: Dec. 7, 2004

(54) VARIABLE DETAIL AUTOMATIC INVOCATION OF TRANSISTOR LEVEL TIMING FOR APPLICATION SPECIFIC INTEGRATED CIRCUIT STATIC TIMING ANALYSIS

(75) Inventors: Paul T. Gutwin, Williston, VT (US); Peter J. Osler, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 371 days.

(21) Appl. No.: 09/682,294

(22) Filed: Aug. 16, 2001

(65) Prior Publication Data

US 2003/0037306 A1 Feb. 20, 2003

(51) Int. Cl.[7] .............................................. G06F 17/50
(52) U.S. Cl. .................................. 716/6; 716/5; 703/19
(58) Field of Search ............................... 716/1, 2, 4, 5, 716/6, 7; 703/13, 14, 17, 19

(56) References Cited

U.S. PATENT DOCUMENTS

| 5,446,676 | A | | 8/1995 | Huang et al. |
| 5,553,008 | A | | 9/1996 | Huang et al. |
| 5,764,532 | A | | 6/1998 | Patel |
| 5,872,717 | A | * | 2/1999 | Yu et al. .................... 716/6 |
| 5,883,811 | A | | 3/1999 | Lam |
| 5,946,475 | A | | 8/1999 | Burks et al. |
| 6,014,510 | A | | 1/2000 | Burks et al. |
| 6,044,211 | A | | 3/2000 | Jain |
| 6,353,916 | B1 | * | 3/2002 | Kuwayama .................... 716/6 |

* cited by examiner

*Primary Examiner*—Leigh M. Garbowski
(74) *Attorney, Agent, or Firm*—McGinn & Gibb, PLLC; Richard M. Kotulak, Esq.

(57) ABSTRACT

A method and system for designing static timing analysis for application specific-type integrated circuits (ASIC). The method includes use of transistor level timing (TLT) methods that are used only when open channel circuit inputs are detected during the generation of the timing graph.

23 Claims, 5 Drawing Sheets

VARIABLE DETAIL AUTOMATIC INVOCATION OF TRANSISTOR LEVEL TIMING FOR APPLICATION SPECIFIC INTEGRATED CIRCUIT STATIC TIMING ANALYSIS

BACKGROUND OF THE INVENTION

1. Field of the Invention

The present invention relates to design tools used in development of application specific integrated circuit (ASIC) technology; and more particularly to techniques for performing timing analysis on circuit designs used in ASICs.

2. Description of the Related Art

Present electronic designing systems consist of software tools running on a digital computer that assist a designer in the creation and verification of complex electronic designs. Electronic computer-aided design (ECAD) systems are widely used in designing semiconductor integrated circuits. In particular, ECAD systems are used to generate data descriptive of the entire circuit layout as well as the layout of individual circuit cells. Since each cell often contains a large number of circuit elements and interconnections among the elements and their respective timing, ECAD systems have become an indispensable tool in the design of integrated circuits.

In the process of creating a large integrated circuit chip design, it is quite useful and customary to partition the logic into manageable pieces and to design hierarchically. This modularity maximizes reuse and simplifies the design. Some of the design pieces or blocks might be custom designed, while others could simply be synthesized ASIC blocks. If the design is to be processed by a timing analysis tool, such as a static timing analyzer, there must at least be timing information for each of the lowest level building blocks of the design. Timing information about these blocks is presented to the timing analysis tool in the form of timing rules.

There currently exist static timing analysis tools, which are commonly made available by vendors of ECAD stations and software, for timing analysis. Timing analysis is performed by software which analyzes the timing relationships between logic state changes within a circuit and determines if certain timing criteria such as minimum setup and hold times have been violated. A static timing analyzer does not attempt to model the circuit as it would operate but rather attempts to analyze a circuit's temporal behavior.

ASIC level static timing analysis requires use of a "netlist" describing the ASIC circuit to be timed, and timing rules. The netlist is a compilation of information descriptive of the primitives (i.e., circuit elements) of a logic circuit. Netlist can also be a cell description (a group of circuit elements) and their interconnection. The timing rules specify the timing for these circuits. Development and verification tools used in ASIC design usually implement a hardware description language. Static timing analysis use a number of industry standard formats for such netlists that include the Netlist Description Format (NDL), the Electronic Data Interchange Format (EDIF), etc. These netlist comprises a list of basic cells used in the design of the system, specifying interconnection among the cells. Connections between or among cells are known as nets. A circuit path through a system comprises a number of cells and the interconnecting nets for the circuit path. In most situations, this modeling provides adequate results, and the circuit can be timed reasonably well. However, a certain class of circuits having "open channel inputs" cannot be timed adequately using present forms of this analysis. Typically in complementary metal oxide semiconductor CMOS based logic circuits, the input pin(s) of a cell is connected to the GATE of a CMOS transistor. An "open channel input" cell refers to a cell where the input pin(s) are connected to the source or drain of a CMOS transistor. In particular, using these conventional timing analytical frameworks for timing results, the load capacitance of each input pin on a particular circuit must be fixed. However, when a circuit has an open channel input, the load capacitance can have many different values. In some pathological situations, the load capacitance measured at the input to a circuit is not a function of that circuit. Instead, it is a function of that circuit and its electrical neighbors and interconnect connecting the circuit to its neighbors, commonly referred to as a static channel connected component (CCC).

To resolve such problems, a static-timing-analysis subsystem called transistor level timing (TLT) is used for timing such "open channel input" circuits. Since TLT disregards gate boundaries, "open channel input" problems do not exist. When TLT partitions a transistor circuit to analyze, this methodology divides the circuit so that no "open channel inputs" in the resulting partition exist.

Figure 1:
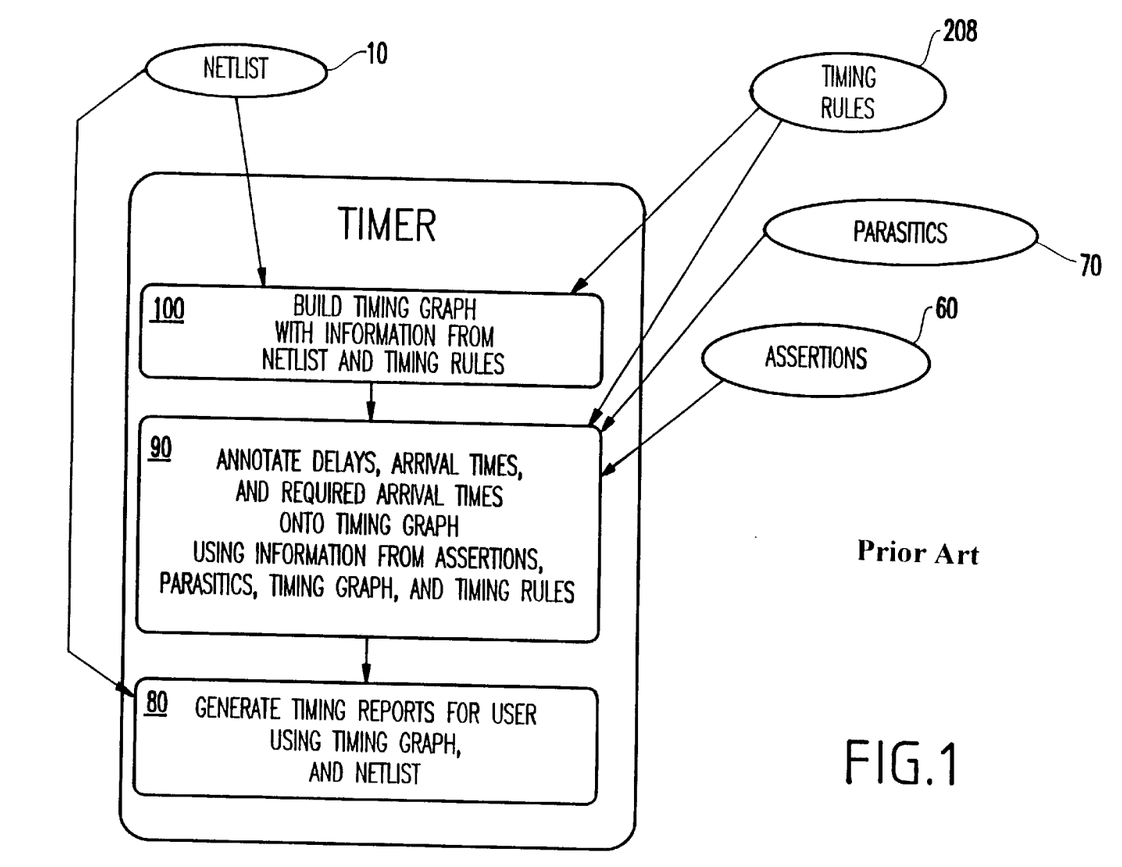
FIG. 1 shows a conventional ASIC timing method using a netlist that is inputted to a timer for generating timing reports using timing rules, parasitics and assertions.

FIG. 1 shows a conventional method of ASIC timing wherein a netlist is provided to a timer for generating a timing report from timing graphs using timing rules, capacitive parasitics and assertions. A NETLIST is an explicit list of cells and their interconnection. A TIMING RULE is a set of data and algorithms which specify the temporal behavior of a particular type of gate under different conditions, such as temperature, voltage, capacitive loading of signal outputs, and rate-of-change (slew) of signal input voltages. PARASITICS specify the electrical characteristics of the interconnections in the netlist, especially the resistance and capacitance. ASSERTIONS specify externally imposed timing constraints of the netlist. Conventional timing graphs for this method are shown in FIGS. 2a–2d as to how these timing graphs are constructed in association with an "open channel input" problem.

Figures 2A, 2B:
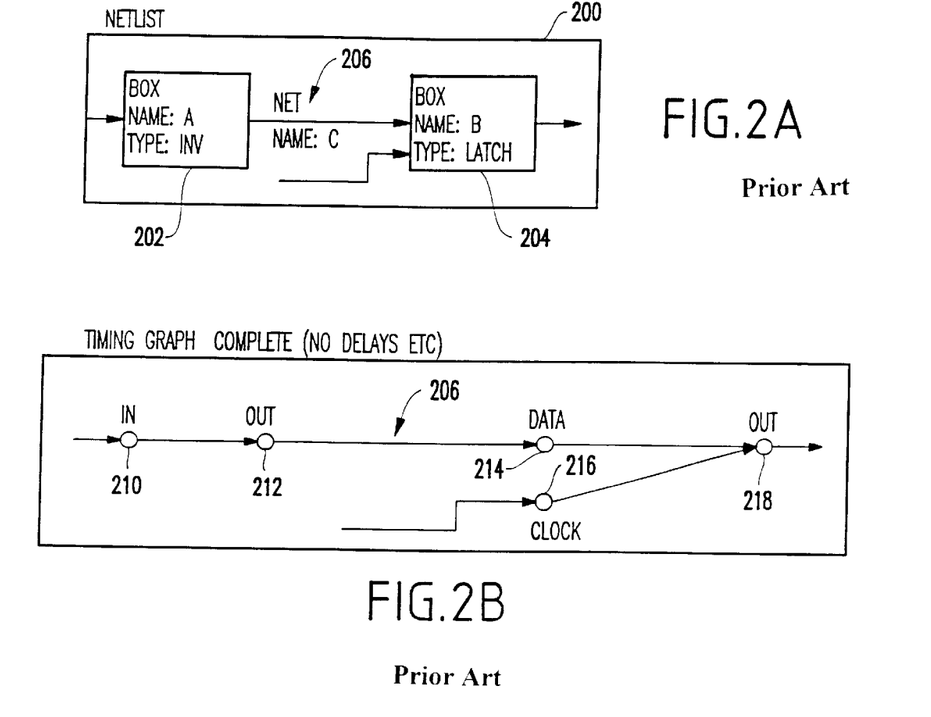
FIGS. 2a, 2b, 2c, and 2d show conventional timing graphs and rules for the method shown in FIG. 1 associated with "open channel input" problems.
Figure 2C:
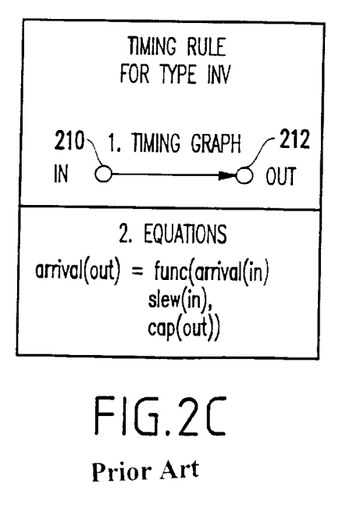
Figure 2D:
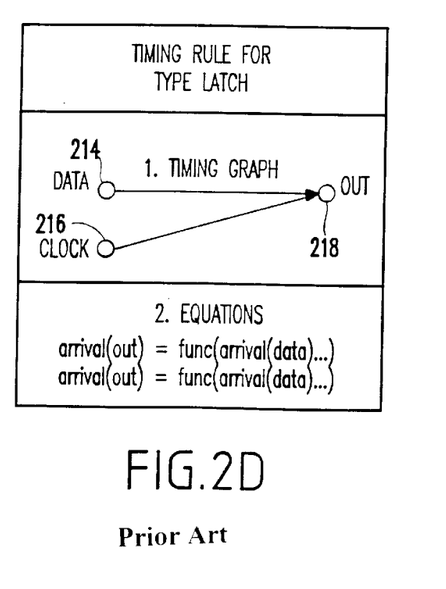

Referring now to FIG. 1, the conventional timing processes is represented in a block diagram. Item 10 of the block diagram is the net list. An example of a net list is shown in FIG. 2a, discussed below. Item 208 illustrates timing rules that the net list 10 must comply with. Exemplary timing rules are shown in FIGS. 2c and 2d, discussed below. Additional variables such as parasitic capacitance 70 and assertions 60 are also shown in FIG. 1. Item 60 of this figure represent the external temporal requirements imposed on the netlist under analysis. These ASSERTIONS might include arrival times at the primary inputs to the netlist, and the arrival times required at the primary outputs of the netlist. In an item 100, these conventional systems build a timing graph with the information from the netlists 10 and the timing rules 208. An example of a timing graph is shown in FIG. 2b, discussed below. In item 90, the timing graph is annotated with the delays, arrival times and required arrival times using the information from the assertions 6, the parasitics 70, the timing graph and the timing rules 208.

In addition, the conventional process generates timing reports for the user using the timing graph and the netlist 10. A timing report is a text or graphical based summary of the temporal behavior of the netlist. This report may include the delay of the longest path through the netlist, an annotated list of the cells (and their individual delays) in the longest path, and the results of timing tests within the netlist and timing tests at the primary inputs and outputs of the netlist. The intent of the timing report is to concisely represent the critical timing(s) within the netlist, and alert the circuit designer to potential situations within the netlist that would prevent the proper operation of the netlist.

As mentioned above FIG. 2a illustrate a net list 200 that includes a first item 202 that is a box having a name A representing an inverter. Box 204 which has a name B and is a latch. The boxes are connected by a net 206 named C. The timing graph shown in FIG. 2b illustrates the input 210 to box A 202 and the output from box A 212. Once again the net 206 connecting the boxes 202, 204 is also shown in FIG. 2b.

The data 214 and clock 216 inputs into box 204 and the output 218 from box 204 are also illustrated in FIG. 2b.

FIG. 2c illustrates the timing rules for the inverter shown in box 202. Equation 2 in FIG. 2c represents a possible function for calculating the delay of the inverter. The data needed to calculate the delay is 210, and the results of the delay calculation are carried to the next box by 212. The delay of the inverter itself is 224.

Similarly, FIG. 2d illustrates the timing rules for the latch 204. Once again the data 214, clock 216 and output 218 are illustrated. As with FIG. 2c, the data and clock delays (226 and 228 respectively) are possibly calculated using equations 2, using the inputs 214 and 216. The details of these delay calculations are not germane to this invention, and hence are represented in prototypical fashion. However, present TLT methods are difficult to implement for an entire transistor design in view of its capacity constraints when compared to standard ASIC timing methods. Thus, this problem presents a need for less complex solutions in applying TLT to the entire ASIC design.

BRIEF SUMMARY OF THE INVENTION

It is, therefore, an object of the present invention to provide an improved method for enhancing accuracy of static timing analysis of an application specific integrated circuit (ASIC).

Conventional systems performed circuit timing analysis using a standard net-based ASIC circuit timing analysis, which is a relatively quick analysis that calculates the circuit's timing by using the timing rules of nets and the netlist, showing the connections between the nets. Also, a more intensive and slower TLT analysis is available. The TLT analysis looks at the actual design of the transistors themselves (and the actual wiring connections between the individual transistors) and uses this design to perform a timing analysis.

The TLT analysis is more complicated and slower than the net-based ASIC circuit timing analysis because the TLT makes individual calculations regarding the design of individual transistors. To the contrary, the net-based analysis begins with the known performance of a previously analyzed group of transistors that are grouped within a single hierarchical level, this group is termed a "net". Therefore, the net-based system uses a library of previous calculations for a group of wiring and devices as a starting point, while the TLT analysis makes such individual transistor/device calculations on its own.

In other words, the net-based analysis takes advantage of the hierarchical structure of libraries that contain know (previously calculated) individual net performance data, while the TLT analysis performs such calculations individually for each analysis. This makes the TLT analysis much slower than the net-based analysis and TLT analysis are not commonly used when net-based analysis are available. However, the present inventors have realized that for a specific group of circuits ("open channel input" circuits) are not properly modeled by net-based analysis, principally because the load capacitance can have many different values in open channel input circuits. However, a TLT analysis will properly model such open channel input circuits. Therefore, to solve the above problem, the inventors have designed a system/method that checks circuits for open channel input circuits, and when such open channel input circuits are identified, the inventive system performs the slower, more intensive TLT analysis on the open channel input circuits.

Therefore, the invention takes advantage of the efficiencies associated with net-based ASIC timing analysis for most circuits. However, upon encountering an open channel input circuit, the invention switches modes and performs the more intensive TLT analysis to provide proper analysis for such circuits.

The invention provides a method and system for designing static timing analysis for application specific-type integrated circuits (ASIC). The method includes use of transistor level timing (TLT) methods that are used only when open channel circuit inputs are detected during the generation of the timing graph.

Thus, it is a further object to provide in an appropriately programmed computer, a static timing analysis method for generating a timing graph of an integrated circuit comprising inputting netlist, timing rules, open channel circuits, and transistor level design data into a timing analysis application; using said netlist to construct an initial timing graph for said integrated circuit; detecting at least one open channel circuit, while constructing said timing graph, and invoking transistor level timing (TLT) analysis for said open channel circuit(s) and static channel connected component (CCC); applying normal timing rules for circuits other than said open channel circuit(s) and said CCC, and using data from said TLT analysis and said normal timing rules to perform static timing analysis on said integrated circuit. The present invention also includes a computer implemented method implementing the method steps set forth above. The present invention also provides the advantage of a systematic generation of timing graphs used in designing an integrated circuit.

BRIEF DESCRIPTION OF THE SEVERAL VIEWS OF THE DRAWINGS

The foregoing and other objects, aspects and advantages will be better understood from the following detailed description of preferred embodiments of the invention with reference to the drawings, in which.

DETAILED DESCRIPTION OF THE INVENTION

Figure 3:
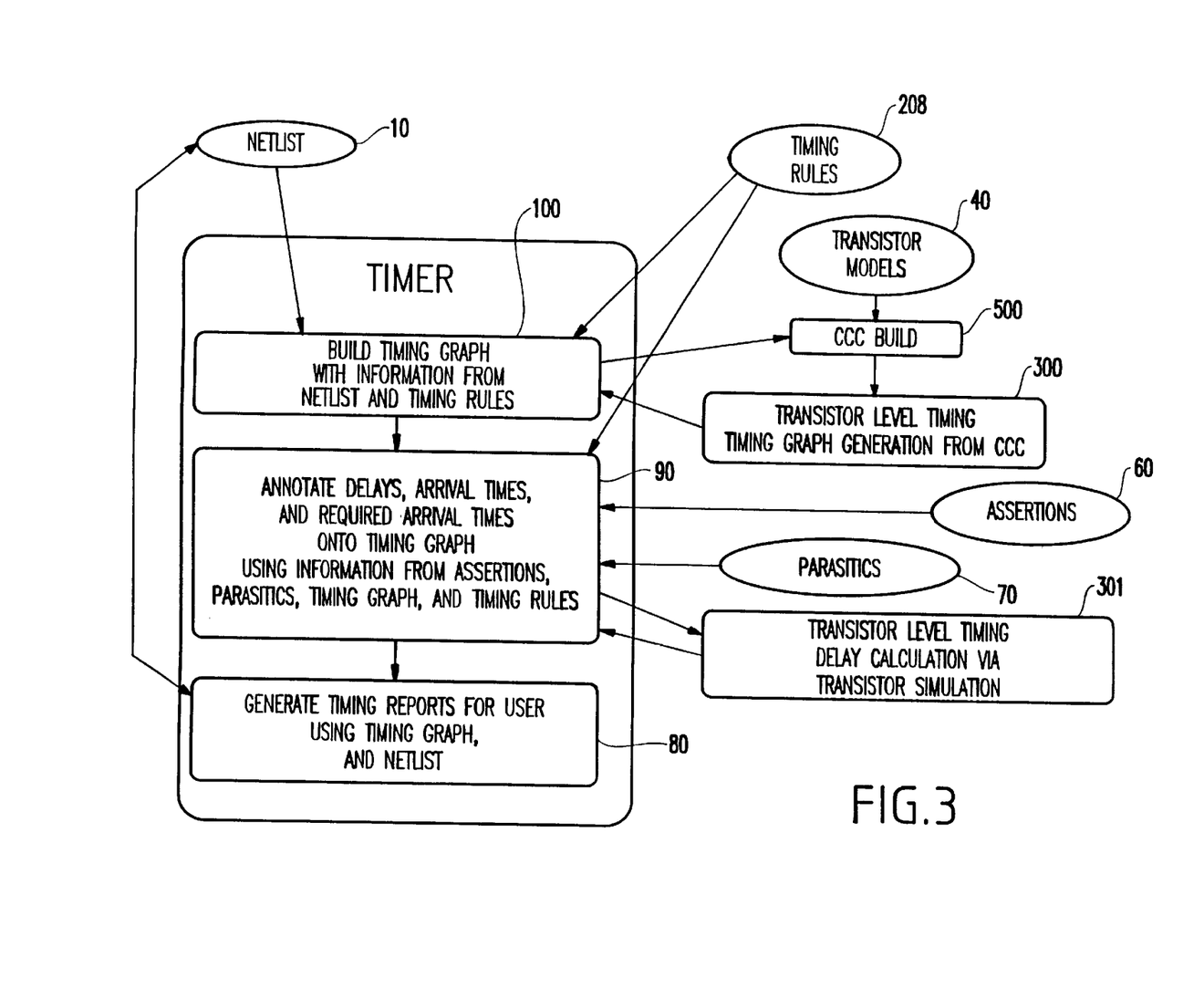
FIG. 3 shows a block diagram illustrating a method according to the present invention.

Referring now to the FIG. 3, in one aspect, the invention is embodied in a process for designing and/or designing and fabricating integrated circuits as to static timing of the integrated circuit. The steps of this process are illustrated in the block diagram of FIG. 3 wherein the design process begins as a high level hierarchical integrated circuit design is developed using a synthesizable high level design language as standardized by I.E.E.E. "Synthesizable" means being able to translate the high level design language into logic gates or blocks using a logic synthesizer.

Similar items in FIG. 1 are identified with the same numbers in FIG. 3. The netlist file 10 defines the ASIC circuit to be timed. It is constructed from system elements connected by input and output nodes to form a network. The wire connections between elements are referred to as "nets." The system connectivity is established through the common input, output, and biput I/O nodes among the circuit elements.

An element can be a single transistor, resistor, capacitor, gate, register, functional model, stimulus function, global timing error function or output probing function.

The netlist data file 10 include element and attribute identifiers. Element identifiers specify the type of function being defined (i.e., element library function, node function, input and output signals), while attribute identifiers indicate the input/output pins, internal state information, and any properties associated with the element. The netlist file may also include capacitance specifications applied to particular nodes, and subcircuit specifications (i.e., collections of elements). A model file contains information for each subcircuit, including the number of input pins, output pins, and biput pins; the pin ordering for the subcircuit interface; the number of states; and whether the subcircuit should be expanded or a model substituted from a model library.

Timing rules data files 208 provide timing rules for custom design blocks of the ASIC and are usually generated via an automatic program, and by hand, or some combination of the two. Transistor level timing subroutines 300 and 301 for circuits can use methods taught in U.S. Pat. No. 5,446,676, entitled "Transistor-level timing and power simulator and power analyzer," which is hereby incorporated by reference.

This patent discloses a method for accurately simulating the timing and power behavior of digital MOS circuits, which includes piece-wise linear modeling of transistors, dynamic and static construction of channel connected components (CCC), event driven simulation and current measuring capabilities for power supplies, grounds, and individual resistors and transistors.

The method accepts the netlist 10 defining the ASIC circuit to be simulated and building an initial timing graph, and a transistor model file 40 containing transistor characteristics including voltage-current array(s) and piece-wise linear transistor approximations created therefrom. Larger CCCs must be constructed dynamically during simulation. Simulation is event driven. An event is a voltage change on a node that exceeds an "event resolution," this voltage change being determined from a previous voltage level which caused an earlier event at the subject node. When a node is identified as having the next pending event, a transistor connected thereto is identified, and either a static or dynamic CCC is constructed 50 based upon the transistor. Once the CCC is established, its response to the pending event is evaluated through linear approximation, wherein each transistor contained in the affected channel connected component is replaced with a current source, resistor and transconductor retrieved from the transistor models file 40. Where a new event or events are identified at the output node(s) of a CCC during the course of evaluation, these events are scheduled for future determination. CCC evaluation, more specifically, is carried out by rigorously solving circuit equations and calculating node voltages and element currents which represent a detailed, simulated circuit response. Element currents may be accumulated for obtaining full chip currents.

Assertions data file 60 provide data that include arrival time at primary inputs, require time at primary outputs, clock phase, frequency and duty cycle information, and other timing related items.

Parasitic capacitance data file 70 includes data as to calibrated gate and diffusion capacitances of the transistors. These capacitances are constant values and are added to discrete capacitors (i.e., those included in netlist 10) to determine total capacitance of a corresponding node. Similar capacitor processing is taught by RSIM and MOTIS. This summation is then stored in a data structure created specifically for the node at issue for subsequent processing.

Figure 4A:
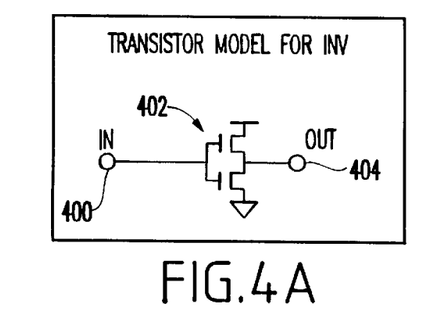
FIGS. 4a, 4b, 4c, and 4d shows generation of a timing graph to illustrate use of the invention.
Figure 4B:
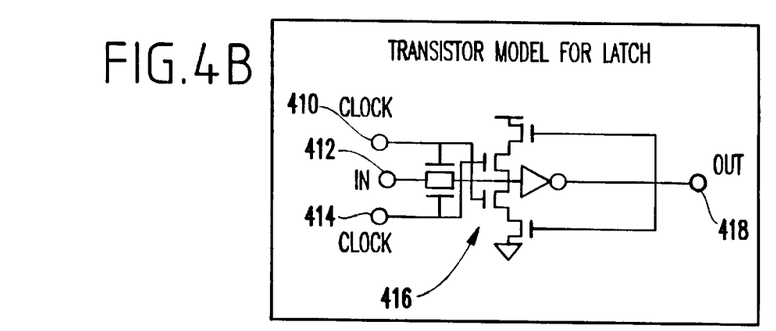
Figure 4C:
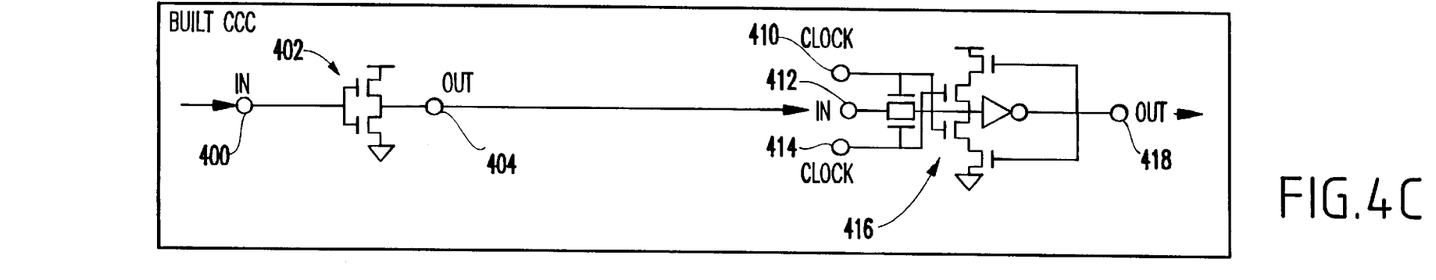
Figure 4D:
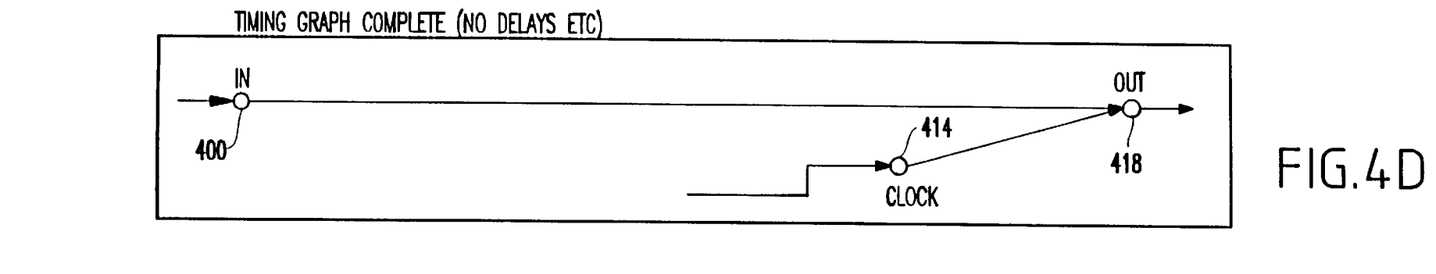

FIGS. 4a–4d illustrate the models, channel connected components, and timing graph output using the method shown in FIG. 3. More specifically, the FIG. 4a illustrates the transistor model for an inverter that includes an input 400, the inverter structure itself 402 and an output 404. In a similar manner, FIG. 4b illustrates a transistor model for a latch that includes an inverted clock signal 410, and input 412 and a corresponding clock signal 414. The latch itself is shown as item 416 and the output in shown as item 418. These elements are combined to create the channel connected components shown in FIG. 4c. The method using the timing rule for the latch as similarly shown in FIG. 2d includes an "open channel circuit" between data input 214 and data output 218 to illustrate use of the invention. Similarly, the netlist 208 and the timing rule for the inverter shown in FIG. 2c is also used in this example. Finally, a timing graph for this example is shown in FIG. 4d. The input to the inverter 400 is shown as well as the clock input 414 and the overall output 418.

In summary, the invention provides a static timing analysis method for generating a timing graph report 80 of an integrated circuit. The invention inputs a netlist 10, timing rules 208. The CCC build process 500 identifies open channel circuits and the transistor level timing analysis 300, 301 is used on the open channel circuits. The CCC build process identifies open channel circuits by iterating through all cells in the netlist. for each cell, the corresponding transistor level model is examined. If any of the inputs to the transistor level model is an open channel input, then the netlist cell is marked as an open channel cell.

The invention uses the netlist 10 to construct an initial timing graph for the integrated circuit and then detects the open channel circuits. Since the open channel circuits may produce different timing results depending upon input capacitance, the invention invokes the transistor level timing (LT) analysis 300, 301 on open channel circuit(s). The invention also applies normal timing rules for circuits other than open channel circuit(s) and combines the results to produce an overall timing graph report 80 for that circuit.

As static timing analysis does its initial pass through the netlist 10 generating a timing graph, on any circuit that doesn't use open-channel inputs, it can use standard ASIC timing rule analyzers for that circuit.

However, if it detects an open-channel circuit, it can automatically invoke TLT 301 based on that circuit and its neighboring CCC. The timing results derived from static-timing's analysis of a generated timing graph 80 provides improved accuracy compared to using conventional ASIC static timing analysis.

While the invention is primarily disclosed as a method, it will be understood by a person of ordinary skill in the art that an apparatus, such as a conventional data processor, including a CPU, memory, I/O, program storage, a connecting bus, and other appropriate components, could be programmed or otherwise designed to facilitate the practice of the method of the invention. Such a processor would include appropriate program means for executing the method of the invention. Also, an article of manufacture, such as a pre-recorded disk or other similar computer program product, for use with a data processing system, could include a storage medium and program means recorded thereon for directing the data processing system to facilitate the practice of the method of the invention. It will be understood that such apparatus and articles of manufacture also fall within the spirit and scope of the invention.

Figure 5:
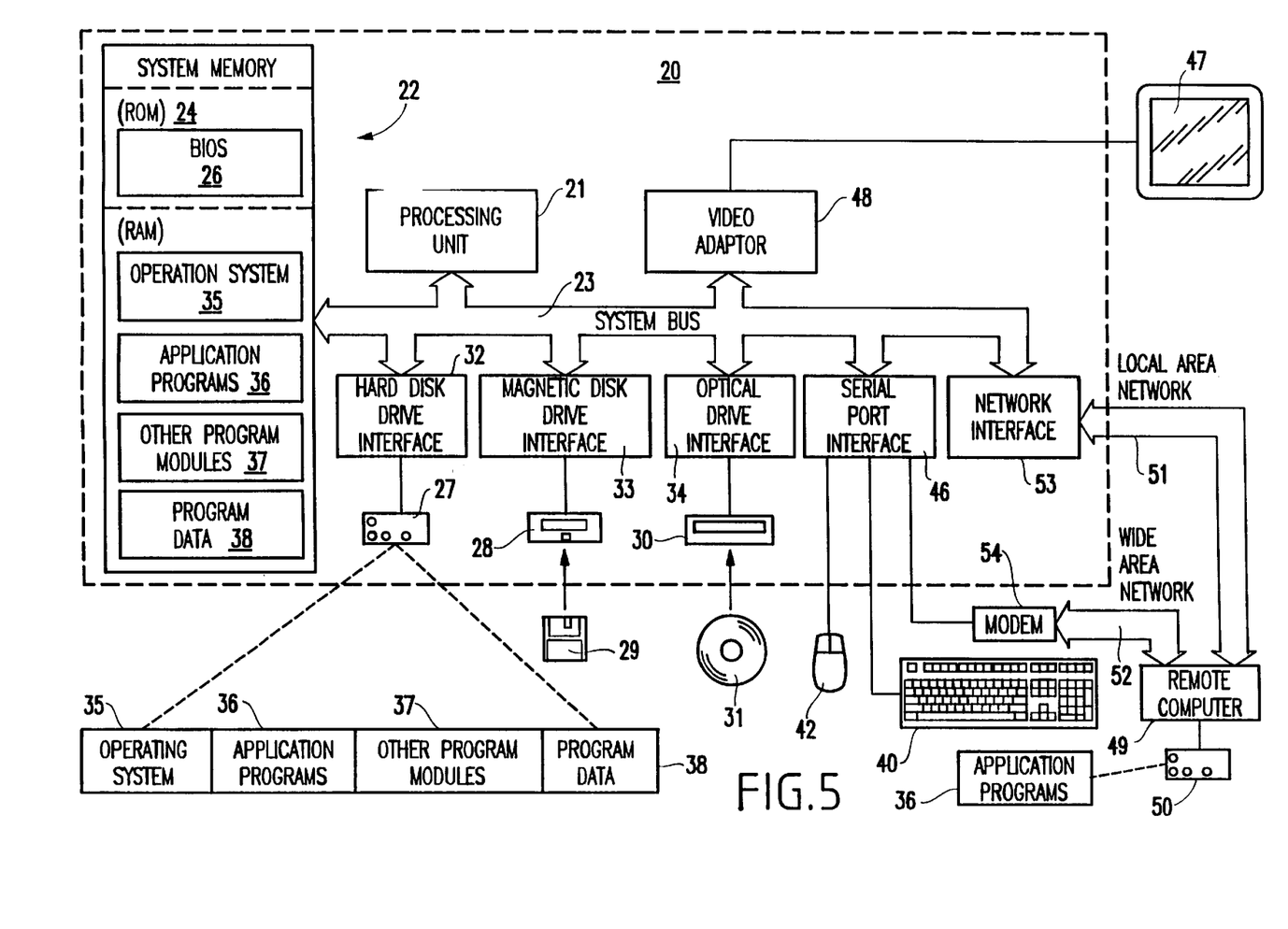
FIG. 5 is an information handling/computer system embodying the present invention.

FIG. 5 shows an exemplary data processing system for practicing the disclosed ASIC static timing analysis methodology that includes a computing device in the form of a conventional computer 20, including one or more processing units 21, a system memory 22, and a system bus 23 that couples various system components including the system memory to the processing unit 21. The system bus 23 may be any of several types of bus structures including a memory bus or memory controller, a peripheral bus, and a local bus using any of a variety of bus architectures.

The system memory includes read only memory (ROM) 24 and random access memory (RAM) 25. A basic input/output system 26 (BIOS), containing the basic routines that helps to transfer information between elements within the computer 20, such as during start-up, is stored in ROM 24.

The computer 20 further includes a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD-ROM or other optical media. The hard disk drive 27, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide nonvolatile storage of computer readable instructions, data structures, program modules and other data for the computer 20. Although the exemplary environment described herein employs a hard disk, a removable magnetic disk 29 and a removable optical disk 31, it should be appreciated by those skilled in the art that other types of computer readable media which can store data that is accessible by a computer, such as magnetic cassettes, flash memory cards, digital video disks, Bernoulli cartridges, random access memories (RAMs), read only memories (ROM), and the like, may also be used in the exemplary operating environment. a program storage device 120 having a storage area 121. Information stored in the storage area in a well-known manner that is readable by a machine, and that tangibly embodies a program of instructions executable by the machine for performing the method of the present invention described herein for data mining applications.

A number of program modules may be stored on the hard disk, magnetic disk 29, optical disk 31, ROM 24 or RAM 25, including an operating system 35, one or more application programs 36, other program modules 37, and program data 38. A user may enter commands and information into the computer 20 through input devices such as a keyboard 40 and pointing device 42. Other input devices (not shown) may include a microphone, joystick, game pad, satellite dish, scanner, or the like. These and other input devices are often connected to the processing unit 21 through a serial port interface 46 that is coupled to the system bus, but may be connected by other interfaces, such as a parallel port, game port or a universal serial bus (USB). A monitor 47 or other type of display device is also connected to the system bus 23 via an interface, such as a video adapter 48. In addition to the monitor, personal computers typically include other peripheral output devices (not shown), such as speakers and printers. The computer 20 may operate in a networked environment using logical connections to one or more remote computers, such as a remote computer 49. The remote computer 49 may be another personal computer, a server, a router, a network PC, a peer device or other common network node, and typically includes many or all of the elements described above relative to the computer 20, although only a memory storage device 50 has been illustrated in FIG. 1a. The logical connections depicted in FIG. 1a include a local area network (LAN) 51 and a wide area network (WAN) 52. Such networking environments are commonplace in offices, enterprise-wide computer networks, intranets and the Internet.

When used in a LAN networking environment, the computer 20 is connected to the local network 51 through a network interface or adapter 53. When used in a WAN networking environment, the computer 20 typically includes a modem 54 or other means for establishing communications over the wide area network 52, such as the Internet. The modem 54, which may be internal or external, is connected to the system bus 23 via the serial port interface 46. In a networked environment, program modules depicted relative to the computer 20, or portions thereof, may be stored in the remote memory storage device. It will be appreciated that the network connections shown are exemplary and other means of establishing a communications link between the computers may be used.

The method of the invention as shown in general form in FIG. 3, may be implemented using standard programming and/or engineering techniques using computer programming software, firmware, hardware or any combination or subcombination thereof. Any such resulting program(s), having computer readable program code means, may be embodied or provided within one or more computer readable or usable media such as fixed (hard) drives, disk, diskettes, optical disks, magnetic tape, semiconductor memories such as read-only memory (ROM), etc., or any transmitting/receiving medium such as the Internet or other communication network or link, thereby making a computer program product, i.e., an article of manufacture, according to the invention. The article of manufacture containing the computer programming code may be made and/or used by executing the code directly from one medium, by copying the code from one medium to another medium, or by transmitting the code over a network.

As shown above, conventional systems perform circuit timing analysis using a standard net-based ASIC circuit timing analysis, which is a relatively quick analysis that calculates the circuit's timing by using the timing rules of nets and the netlist, showing the connections between the nets. Also, a more intensive and slower TLT analysis is available. The TLT analysis looks at the actual design of the transistors themselves (and the actual wiring connections between the individual transistors) and uses this design to perform a timing analysis. The TLT analysis is more complicated and slower than the net-based ASIC circuit timing analysis because the TLT makes individual calculations regarding the design of individual transistors. To the contrary, the net-based analysis begins with the known performance of a previously analyzed group of transistors that are grouped within a single heirarchical level, this group is termed a "net". Therefore, the net-based system uses a library of previous calculations for a group of wiring and devices as a starting point, while the TLT analysis makes such individual transistor/device calculations on its own.

In other words, the net-based analysis takes advantage of the hierarchical structure of libraries that contain know (previously calculated) individual net performance data, while the TLT analysis performs such calculations individually for each analysis. This makes the TLT analysis much slower than the net-based analysis and TLT analysis are not commonly used when net-based analysis are available. However, the present inventors have realized that for a specific group of circuits ("open channel input" circuits) are not properly modeled by net-based analysis, principally because the load capacitance can have many different values in open channel input circuits. However, a TLT analysis will properly model such open channel input circuits. Therefore, to solve the above problem, the inventors have designed a system/method that checks circuits for open channel input circuits, and when such open channel input circuits are identified, the inventive system performs the slower, more intensive TLT analysis on the open channel input circuits.

Therefore, the invention takes advantage of the efficiencies associated with net-based ASIC timing analysis for most circuits. However, upon encountering an open channel input circuit, the invention swithes modes and performs the more intensive TLT analysis to provide proper analysis for such circuits.

While the invention has been particularly described and illustrated with reference to a preferred embodiment, it will be understood by those skilled in the art that changes in the description or illustrations may be made with respect to form or detail without departing from the spirit and scope of the invention.

What is claimed is:

1. A method of performing timing analysis of an integrated circuit, said method comprising:

inputting device data regarding devices within said integrated circuit;

determining whether said integrated circuit includes open channel input circuits;

performing a transistor level timing analysis on said open channel input circuits found in said determining process;

performing a net-based timing analysis on portions of said integrated circuit not having said open channel input circuits; and combining data from said transistor level timing analysis and said net-based timing analysis to produce timing data for said integrated circuit.

2. The method in claim 1, wherein said net-level timing analysis:

segregates said integrated circuit into groups of devices and heirarchical levels of groups;

utilizes previously calculated performance data to represent said groups as nets; and produces a timing analysis of said integrated circuit based on said nets.

3. The method in claim 1, wherein said transistor level timing analysis:

calculates performance data for devices within said open channel input circuits; and produces a timing analysis for said open channel input circuits based on said performance data.

4. The method in claim 1, wherein said process of determining whether said integrated circuit includes open channel input circuits comprises:

evaluating whether groups of said devices have variable capacitance loads; and identifying connected groups of devices that have variable capacitance loads as said open channel input circuits.

5. The method in claim 1, wherein said device data includes circuit timing rules, parasitic capacitance values, and external timing constraints.

6. The method in claim 1, further comprising producing a timing graph from said combining process.

7. A method of performing timing analysis of an application specific integrated circuit (ASIC), said method comprising:

inputting netlist data regarding nets within said ASIC;

building transistor models of said nets;

determining, based on said models, whether any of said nets include open channel input circuits;

performing a transistor level timing analysis on nets having said open channel input circuits;

performing a net-based timing analysis on nets not having said open channel input circuits; and combining data from said transistor level timing analysis and said net-based timing analysis to produce timing data for said ASIC.

8. The method in claim 7, wherein said net-level timing analysis:

utilizes previously calculated performance data of said nets; and produces a timing analysis of said ASIC based on said nets.

9. The method in claim 7, wherein said transistor level timing analysis:

calculates performance data for devices within nets having said open channel input circuits; and produces a timing analysis for said nets having said open channel input circuits based on said performance data.

10. The method in claim 7, wherein said process of determining whether said ASIC includes open channel input circuits comprises:

evaluating whether groups of said devices have variable capacitance loads; and identifying connected groups of devices that have variable capacitance loads as said open channel input circuits.

11. The method in claim 7, wherein said netlist includes circuit timing rules, parasitic capacitance values, and external timing constraints.

12. The method in claim 7, further comprising producing a timing graph from said combining process.

13. A method of performing timing analysis of an application specific integrated circuit (ASIC), said method comprising:

inputting netlist data regarding nets within said ASIC;

building transistor models of said nets;

determining, based on said models, whether any of said nets include open channel input circuits;

performing a transistor level timing analysis on nets having said open channel input circuits to form first timing graphs;

performing a net-based timing analysis on nets not having said open channel input circuits to form second timing graphs; and combining said first timing graphs and said second timing graphs to produce an overall timing graph for said ASIC.

14. The method in claim 13, wherein said net-level timing analysis:

utilizes previously calculated performance data of said nets; and produces a timing analysis of said ASIC based on said nets.

15. The method in claim 13, wherein said transistor level timing analysis:

calculates performance data for devices within nets having said open channel input circuits; and produces a timing analysis for said nets having said open channel input circuits based on said performance data.

16. The method in claim 13, wherein said process of determining whether said ASIC includes open channel input circuits comprises:

evaluating whether groups of said devices have variable capacitance loads; and identifying connected groups of devices that have variable capacitance loads as said open channel input circuits.

17. The method in claim 13, wherein said netlist includes circuit timing rules, parasitic capacitance values, and external timing constraints.

18. A program storage device readable by machine, tangibly embodying a program of instructions executable by said machine for performing method of performing timing analysis of an integrated circuit, said method comprising:

inputting device data regarding devices within said integrated circuit;

determining whether said integrated circuit includes open channel input circuits;

performing a transistor level timing analysis on said open channel input circuits found in said determining process;

performing a net-based timing analysis on portions of said integrated circuit not having said open channel input circuits; and combining data from said transistor level timing analysis and said net-based timing analysis to produce timing data for said integrated circuit.

19. The program storage device in claim 18, wherein said net-level timing analysis:

segregates said integrated circuit into groups of devices and hierarchical levels of groups;

utilizes previously calculated performance data to represent said groups as nets; and produces a timing analysis of said integrated circuit based on said nets.

20. The program storage device in claim 18, wherein said transistor level timing analysis:

calculates performance data for devices within said open channel input circuits; and produces a timing analysis for said open channel input circuits based on said performance data.

21. The program storage device in claim 18, wherein said process of determining whether said integrated circuit includes open channel input circuits comprises:

evaluating whether groups of said devices have variable capacitance loads; and identifying connected groups of devices that have variable capacitance loads as said open channel input circuits.

22. The program storage device in claim 18, wherein said device data includes circuit timing rules, parasitic capacitance values, and external timing constraints.

23. The program storage device in claim 18, wherein said method further comprises producing a timing graph from said combining process.

* * * * *